US006907588B2

(12) United States Patent
Balasubramanian et al.

(10) Patent No.: US 6,907,588 B2
(45) Date of Patent: Jun. 14, 2005

(54) CONGESTION ESTIMATION FOR REGISTER TRANSFER LEVEL CODE

(75) Inventors: Balamurugan Balasubramanian, Mountain View, CA (US); Juergen Lahner, Sunnyvale, CA (US); Srinivas Adusumalli, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 233 days.

(21) Appl. No.: 10/334,743

(22) Filed: Dec. 31, 2002

(65) Prior Publication Data

US 2004/0128639 A1 Jul. 1, 2004

(51) Int. Cl.$^7$ .............................................. G06F 17/50
(52) U.S. Cl. ............................. 716/5; 716/13; 716/14; 716/7; 716/18
(58) Field of Search .............................. 716/5, 13, 14, 716/7, 18

(56) References Cited

U.S. PATENT DOCUMENTS

| | | | | |
|---|---|---|---|---|
| 4,831,725 A | * | 5/1989 | Dunham et al. | 29/847 |
| 4,890,238 A | * | 12/1989 | Klein et al. | 716/7 |
| 5,309,370 A | * | 5/1994 | Wong | 716/13 |
| 5,555,201 A | | 9/1996 | Dangelo et al. | 716/1 |
| 5,838,583 A | * | 11/1998 | Varadarajan et al. | 716/9 |
| 6,145,117 A | | 11/2000 | Eng | 716/18 |
| 6,230,304 B1 | * | 5/2001 | Groeneveld et al. | 716/7 |
| 6,289,498 B1 | | 9/2001 | Dupenloup | 716/18 |
| 6,292,931 B1 | | 9/2001 | Dupenloup | 716/18 |
| 6,360,356 B1 | | 3/2002 | Eng | 716/18 |
| 6,378,123 B1 | | 4/2002 | Dupenloup | 716/18 |
| 6,421,818 B1 | | 7/2002 | Dupenloup et al. | 716/18 |
| 6,438,730 B1 | | 8/2002 | Atmakuri et al. | 716/1 |
| 6,493,658 B1 | * | 12/2002 | Koford et al. | 703/1 |
| 6,519,745 B1 | * | 2/2003 | Srinivas et al. | 716/5 |
| 6,536,028 B1 | * | 3/2003 | Katsioulas et al. | 716/17 |

(Continued)

FOREIGN PATENT DOCUMENTS

| | | | | |
|---|---|---|---|---|
| JP | 11297839 A | * | 10/1999 | H01L/21/82 |
| JP | 2000357744 A | * | 12/2000 | H01L/21/82 |

OTHER PUBLICATIONS

NB82123619, "Weighted and Iterative Multi–wire Routing", IBM Technical Disclosure Bulletin, vol. 25, No. 7B, Dec., 1982 pp. 3619–3628 (12 pages).*

NN7308734, "Prewire Prediction Model", IBM Technical Disclosure Bulletin, vol. 16, No. 3, Aug. 1973, pp. 734–744 (11 pages).*

Pandini et al., "Congestion–aware logic synthesis", Proceedings of Design, Automation and Test in Europe Conference and Exhibition, Mar. 4, 2002, pp. 664–671.*

Cong et al., "DUNE–a multilayer gridless routhing system", IEEE Transactions on Computer–Aided Design of Integrated Circuits and Systems, vol. 20, No. 5, May 2001, pp. 633–647.*

Focus Report: Logic Synthesis and Silicon Compilation Tools by Steven E. Schulz, Eedesign; http://www.eedesign.com/eedesign/focusreport9605.html.

*Primary Examiner*—Matthew Smith
*Assistant Examiner*—Phallaka Kik
(74) *Attorney, Agent, or Firm*—Fitch, Even, Tabin & Flannery

(57) ABSTRACT

A method of estimating congestion for register transfer level code includes steps for receiving as input a floor plan mapped from the register transfer level code, identifying regions in the floor plan, computing routing demand numbers for the regions in the floor plan, computing routing resource numbers for the regions in the floor plan, and generating a congestion estimate of the register transfer level code as a function of the routing demand numbers and the routing resource numbers.

14 Claims, 4 Drawing Sheets

U.S. PATENT DOCUMENTS

| | | | |
|---|---|---|---|
| 6,671,859 B1 * | 12/2003 | Naylor et al. | 716/2 |
| 6,854,099 B2 * | 2/2005 | Dewey et al. | 716/5 |
| 2001/0010090 A1 * | 7/2001 | Boyle et al. | 716/2 |
| 2003/0051217 A1 * | 3/2003 | Cheng | 716/5 |
| 2003/0182649 A1 * | 9/2003 | Harn | 716/11 |
| 2004/0010765 A1 * | 1/2004 | Jiang et al. | 716/9 |
| 2004/0040007 A1 * | 2/2004 | Harn | 716/11 |
| 2004/0103387 A1 * | 5/2004 | Teig et al. | 716/13 |
| 2004/0117753 A1 * | 6/2004 | Kahng et al. | 716/12 |
| 2004/0139413 A1 * | 7/2004 | DeHon et al. | 716/9 |

\* cited by examiner

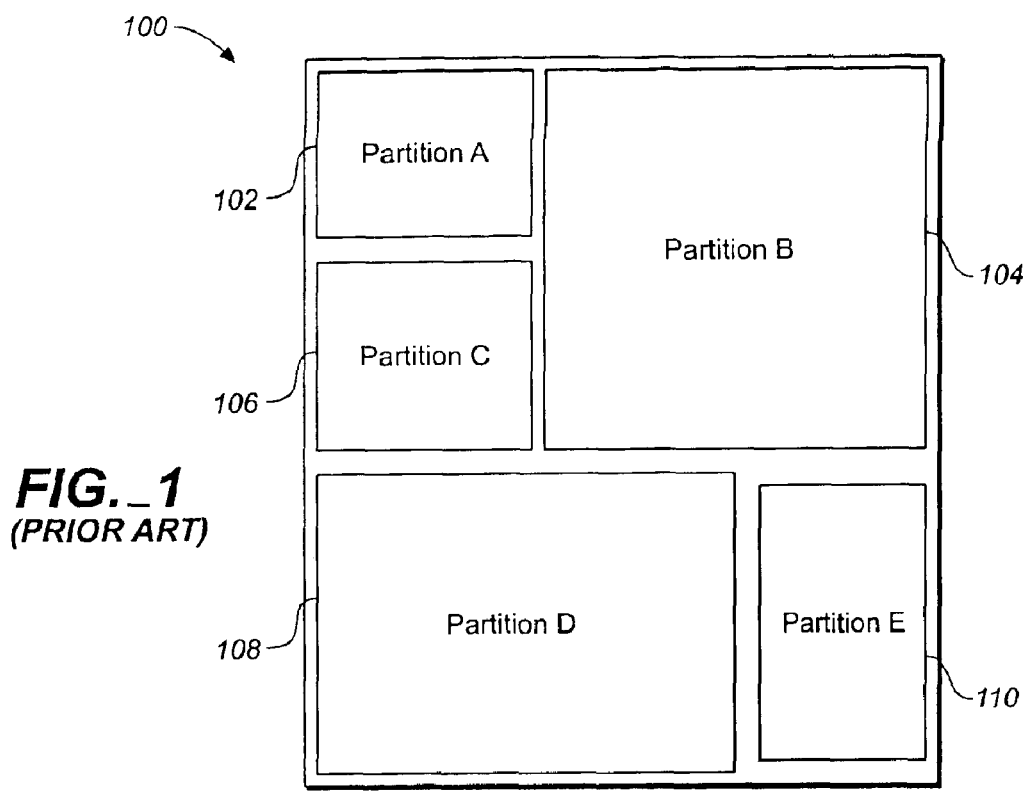
FIG._1
*(PRIOR ART)*
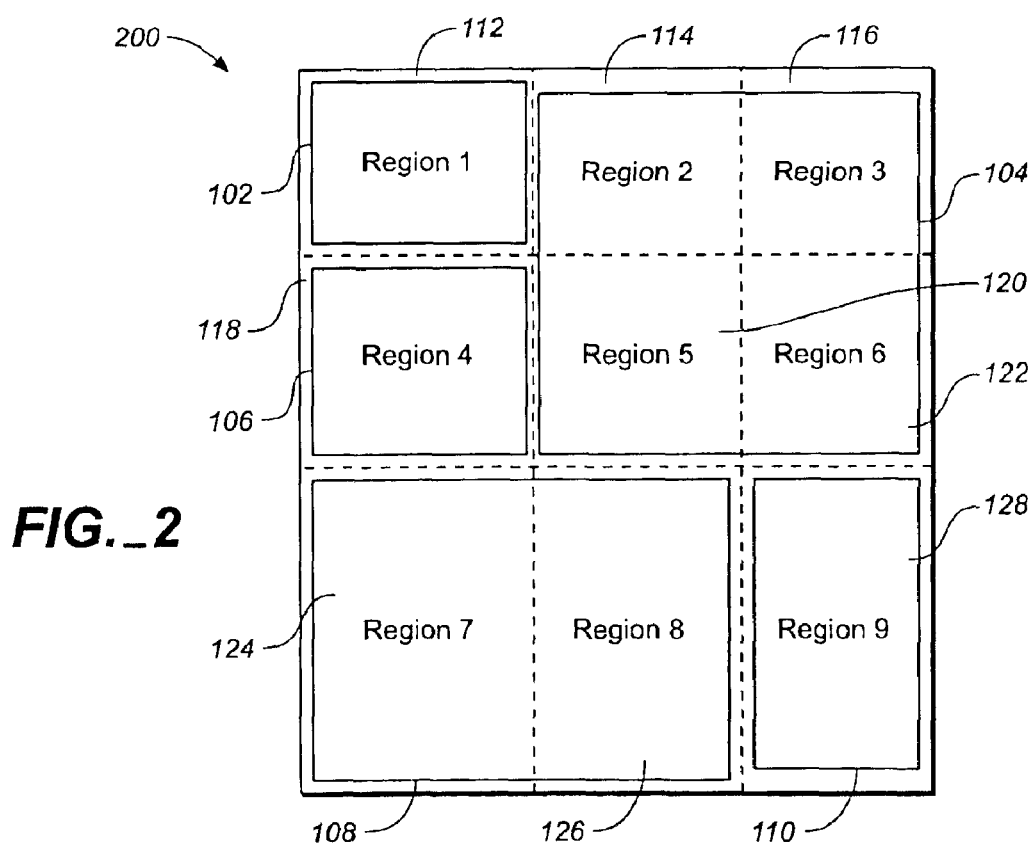
FIG._2

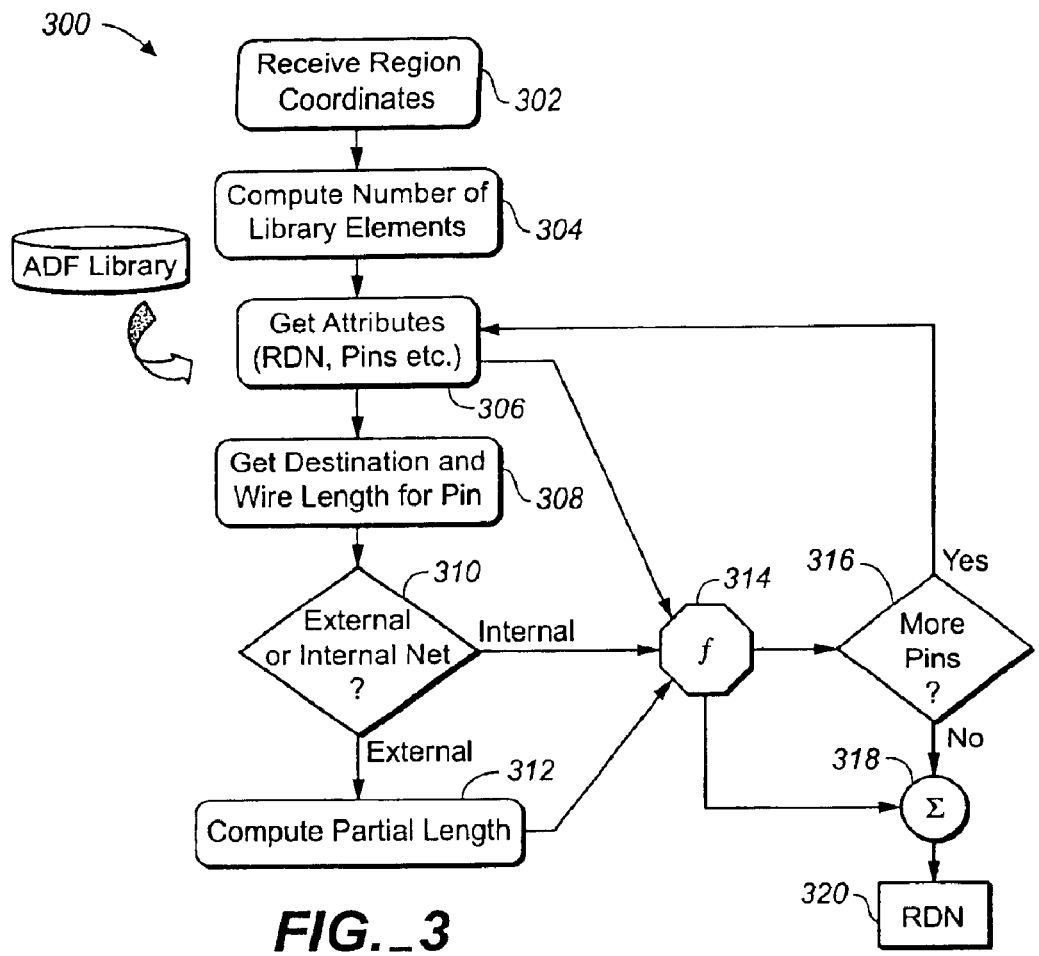
FIG._3
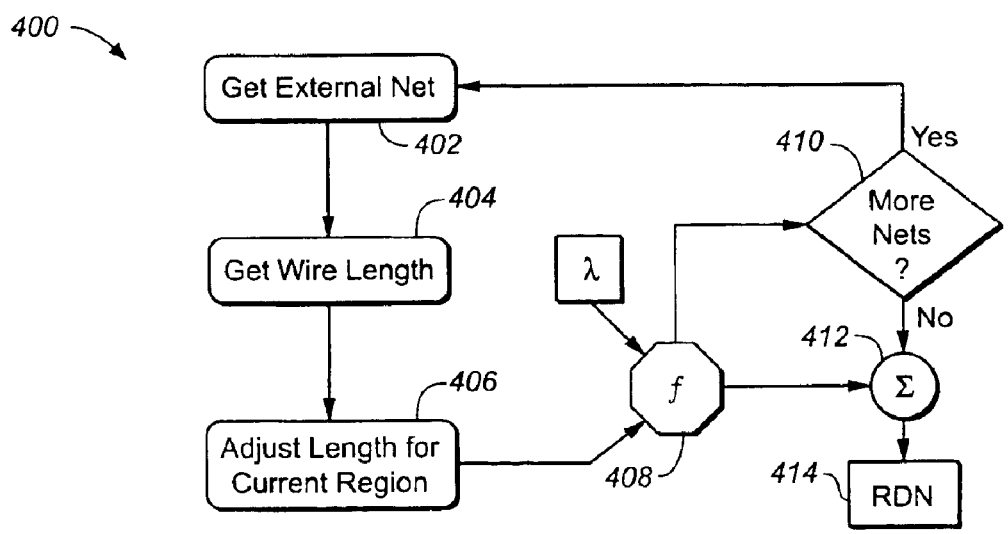
FIG._4

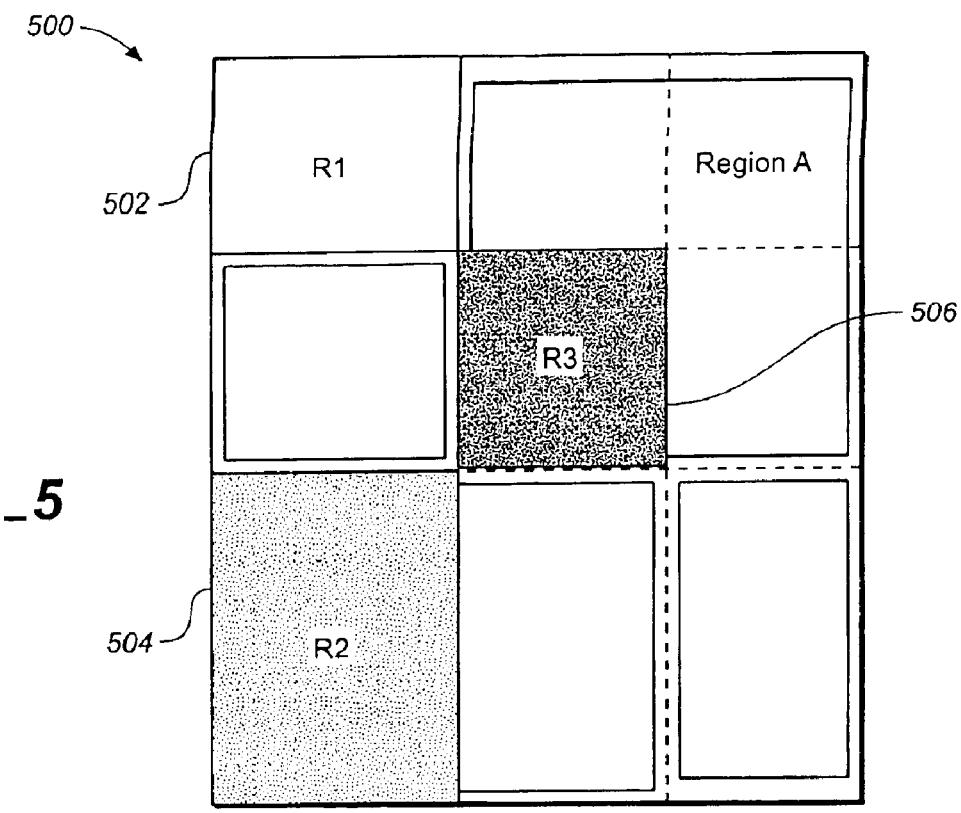
FIG._5
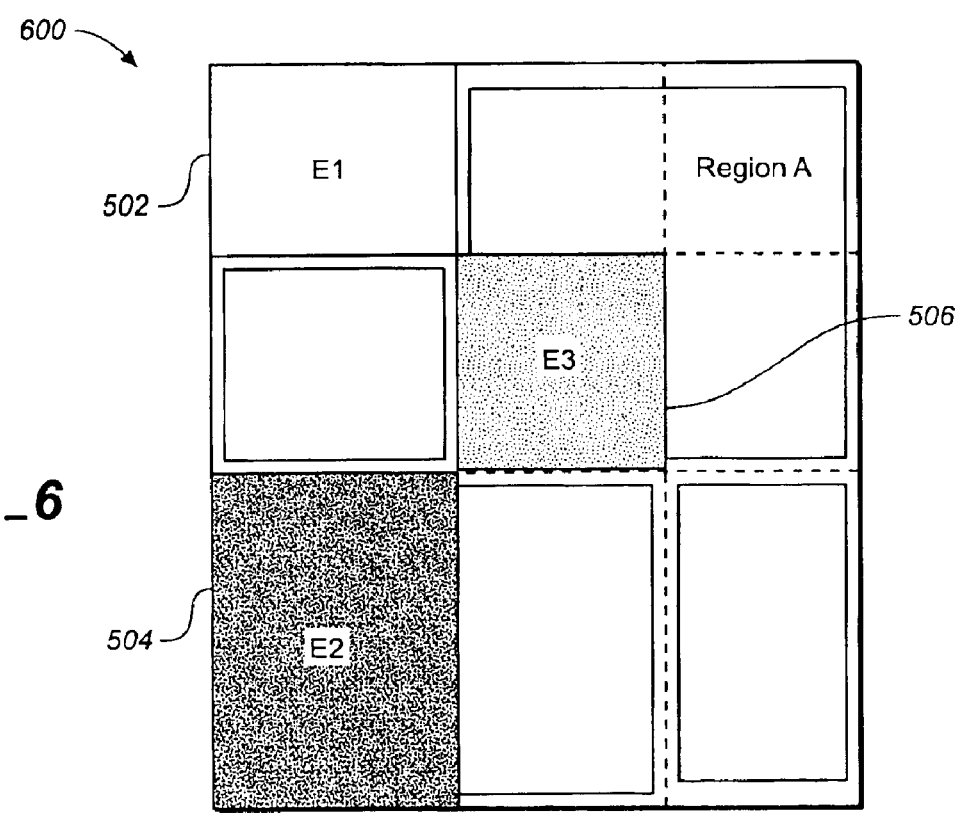
FIG._6

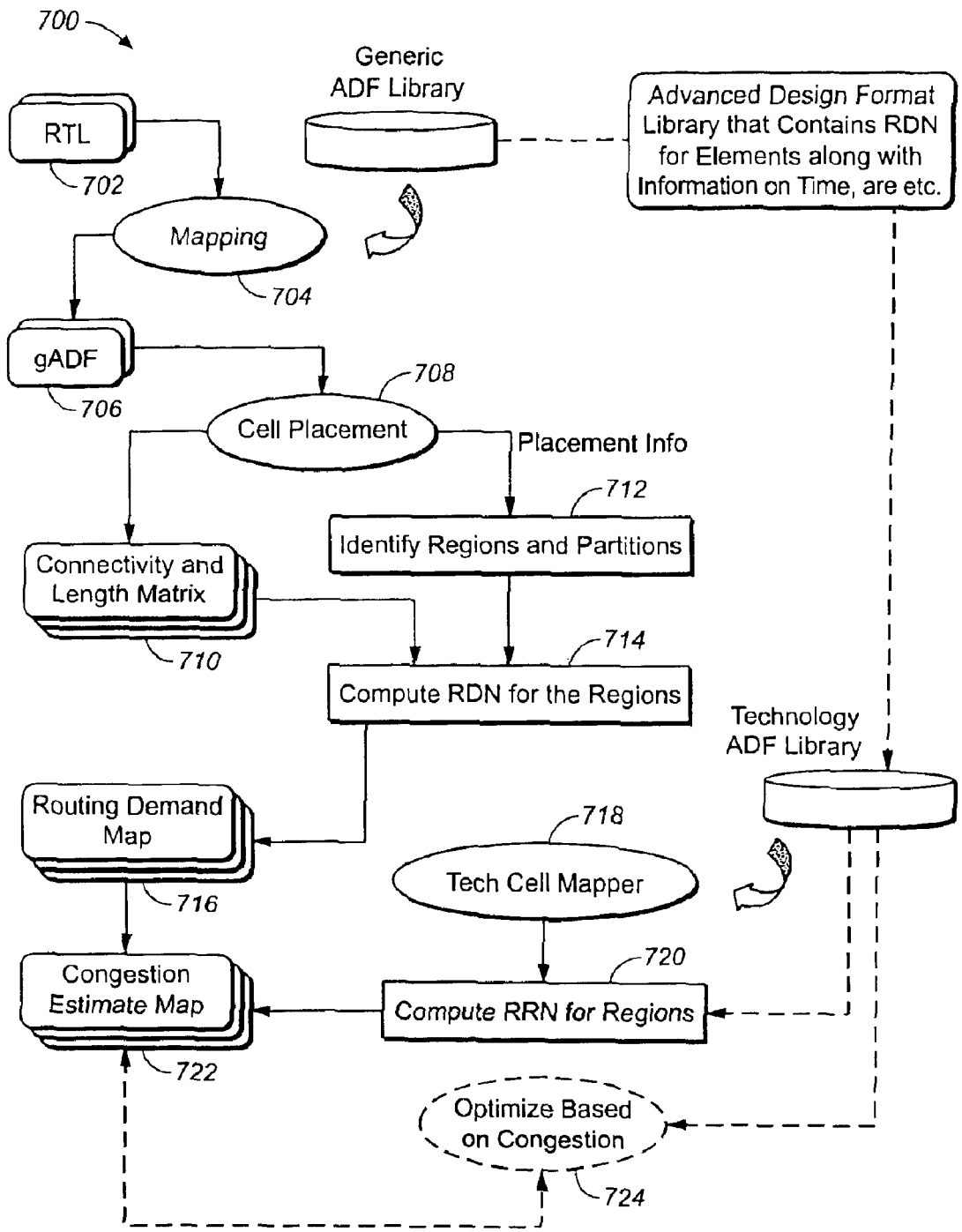
FIG._7

CONGESTION ESTIMATION FOR REGISTER TRANSFER LEVEL CODE

BACKGROUND OF THE INVENTION

1. Field of the Invention

The present invention is directed to the manufacture of integrated circuits. More specifically, but without limitation thereto, the present invention is directed to a method of avoiding congestion inherent in register transfer level (RTL) code used in the design of integrated circuits.

2. Description of the Prior Art

Previously, congestion resulting from routing signals in an integrated circuit has only been estimated at the netlist cell placement stage. At this late stage in the design cycle, different cell placement options and/or padding cells are typically used to provide more routing area to resolve the estimated congestion.

SUMMARY OF THE INVENTION

In one aspect of the present invention, a method of estimating congestion for register transfer level code includes steps for receiving as input a floor plan mapped from the register transfer level code, identifying regions in the floor plan, computing routing demand numbers for the regions in the floor plan, computing routing resource numbers for the regions in the floor plan, and generating a congestion estimate of the register transfer level code as a function of the routing demand numbers and the routing resource numbers.

In another aspect of the present invention, a computer program product for estimating congestion for register transfer level code includes a medium for embodying a computer program for input to a computer and a computer program embodied in the medium for causing the computer to perform steps for receiving as input a floor plan mapped from the register transfer level code, identifying regions in the floor plan, computing routing demand numbers for the regions in the floor plan, computing routing resource numbers for the regions in the floor plan, and generating a congestion estimate of the register transfer level code as a function of the routing demand numbers and the routing resource numbers.

DESCRIPTION OF THE DRAWINGS

The present invention is illustrated by way of example and not limitation in the accompanying figures, in which like references indicate similar elements throughout the several views of the drawings, and in which:

FIG. 1 illustrates an example of a typical floor plan divided into partitions according to the prior art;

FIG. 2 illustrates an example of the floor plan of FIG. 1 divided into regions according to an embodiment of the present invention;

FIG. 3 illustrates a flow diagram of a method of computing the internal routing demand number of a region according to an embodiment of the present invention;

FIG. 4 illustrates a flow diagram of a method of computing the external routing demand number for the region in FIG. 3;

FIG. 5 illustrates an example of a routing demand map of a floor plan of an integrated circuit design according to an embodiment of the present invention;

FIG. 6 illustrates an example of a congestion map of a floor plan of an integrated circuit design according to an embodiment of the present invention; and FIG. 7 illustrates a flow diagram of a method of estimating congestion according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

Previous methods of estimating congestion in an integrated circuit design are performed only at the netlist cell placement stage, which is too late in the design cycle to avoid congestion problems that may result in netlists that are unroutable or cannot meet timing requirements. Rearranging cell placement may resolve congestion at one level, but the congestion may reappear again in the detailed routing phase when the actual routing demands are known. As a result, a significant amount of added effort may be required to modify the register transfer level (RTL) code. The changes then need to be merged into the layout database, sometimes requiring a completely new layout.

Another disadvantage of typical RTL code is that critical paths are ignored during synthesis of the netlist because the synthesis tool is unable to meet the timing requirements of the critical paths, often resulting in a large number of critical paths in the physical design. The large number of critical paths in turn creates difficulties for the layout tools, resulting in unacceptably long layout cycles.

Still another disadvantage of typical RTL code is that complex RTL structures may not be recognized during synthesis of the netlist. Without appropriate intervention by the designer, synthesis tool runtimes may increase dramatically.

The disadvantages of typical RTL described above indicate the need for physical RTL analysis tools that can estimate how RTL coding constructs appear in terms of timing and congestion in the physical design. Specifically, the problem constructs inherent in the RTL code need to be identified, and direction needs to be provided on how to optimize the RTL code to remove the physical implementation barriers.

Congestion is a fundamental issue in very large scale integrated circuit (VLSI) design. Congestion estimation and analysis have gained increasing importance as the size and complexity of designs grow. It is therefore desirable to identify potential congestion problems early in the design cycle. Previous methods of estimating congestion are typically employed in the netlist placement phase, when the design information is lost in a multitude of gates and the placement of cells is nearly fixed. Even though congestion avoidance is the main objective of currently used global routing tools, optimization performance of these tools is minimal, because congestion is primarily due to the manner in which the RTL code was designed than to cell placement and/or netlist synthesis. Reducing utilization and increasing cell padding size may assist in reducing congestion, but not enough to avoid significant design delays. There is insufficient insight at the netlist placement phase to enable redesigning or repartitioning the design at the RTL code level. The global routing tools simply pass on the congestion problems to the next phase of the design, for example, detailed routing, or else generate timing tradeoffs.

In one aspect of the present invention, congestion is estimated at the RTL floor-planning phase while the architecture of the design is still visible. In one embodiment, a routing demand number (RDN) is included in each element of a cell library to define the internal routing demand of the logic element and the contribution of the internal routing demand to the routing congestion of the design. A routing demand number may also be computed for a partition or a region of a library element. Two parameters are associated with the routing demand number, a routing resource number (RRN) and a congestion estimate value (CEV).

The routing resource number (RRN) is defined as a function of routing resources available for a given technology, for example, the number of metal layers and the number of routing tracks per grid. The routing resource number applies to a region, a logical partition, and to a physical partition or physical design.

The routing demand number (RDN) is defined as a function of routing demand, for example, the number of interconnects, the length of the interconnects, and the number of library elements included. The routing demand number is divided into an external routing demand number and an internal routing demand number. The internal routing demand number specifies the demand associated with the interconnects associated with a region, a logical partition, or a physical partition or design. The external routing demand number specifies the demand associated with the interconnects that cross the region, logical partition, or physical partition or design.

The congestion estimate value (CEV) is defined as the difference between the routing demand number and the routing resource number and may be expressed by the following formula:

$$CEV(\text{region}) = RDN(\text{region}) - RRN(\text{region}) \quad (1)$$

where region is used herein to indicate a region, a logical partition, or a physical partition or design. If the CEV is positive, that is, if the routing demand exceeds the routing resources, then congestion is indicated.

FIG. 1 illustrates an example of a typical floor plan 100 divided into partitions according to the prior art. Shown in FIG. 1 are a partition A 102, a partition B 104, a partition C 106, a partition D 108, and a partition E 110.

The synthesis and floor-planning phase determines the size and location of the logical and physical partitions from user input and the connectivity matrix.

FIG. 2 illustrates and example of a floor plan 200 divided into regions according to an embodiment of the present invention. Shown in FIG. 2 are a partition A 102, a partition B 104, a partition C 106, a partition D 108, a partition E 110, a region 1 112, a region 2 114, a region 3 116, a region 4 118, a region 5 120, a region 6 122, a region 7 124, a region 8 126, and a region 9 128.

For congestion estimation purposes, the user may specify a region that may include one or more logical and physical partitions or part of a logical or physical partition. For example, region 7 124 includes approximately one-half of the partition D 108, while region 1 112 includes all of the partition A 102. The region may also be defined by a grid specified by the user with physical coordinates.

The routing demand number may be computed from the connectivity matrix for each region or partition as the total of the internal routing demand and the external routing demand as follows.

The internal routing demand is a function of the number and type of library elements in the region, the length of the internal interconnects and the partial length of external interconnects that originate or terminate within the region.

Each library element included within the region has an associated routing demand number stored, for example, in the cell library, that contributes to the internal routing demand of the region. The internal routing demand number for the region may be expressed by the following formula:

$$RDN_{internal} = f(RDN_{element}, WL_{I-net}, \partial(WL_{E-net})) \quad (2)$$

where $RDN_{element}$ is the sum of the routing demand numbers for every library element in the region, $WL_{I-net}$ is the wire length of the internal interconnects, and $\partial(WL_{E-net})$ is the partial wire length of an external net based on the distance between a library element pin and an input or output of the region or partition.

FIG. 3 illustrates a flow diagram 300 of a method of computing the internal routing demand number of a region according to an embodiment of the present invention.

In step 302, the coordinates of a region of a floor plan are received as input.

In step 304, the number of library elements within the region are computed.

In step 306, the routing attributes of the library elements, for example, the routing demand number of each library element, the number of pins, and timing information, is received from an Advanced Design Format library.

In step 308, the net connected to the next input or output pin of a library element in the region is identified, and the wire length for the net is determined from the floor plan.

In step 310, if the net is an external net, that is, if the net extends between the current region and another region, then control is transferred to step 312. If the net is an internal net, that is, if the net extends only between elements in the current region, then control is transferred to step 313.

In step 312, the partial wire length of the external net inside the current region is computed according to well-known techniques, and control is transferred to step 314.

In step 313, the full wire length of the net within the current region is selected.

In step 314, the internal routing demand number defined by formula (2) is computed.

In step 316, if more input or output pins remain in the region, then control is transferred to step 306. Otherwise, control is transferred to step 318.

In step 318, the result of step 314 is added to the routing demand number.

In step 320, the internal routing demand number is generated as output.

The external routing demand is generated from nets that do not belong to the region, but cross over the region. The external routing demand may be expressed as a function of the number of external nets and their corresponding wire length as follows:

$$RDN_{External} = f(WL_{E-net}, \lambda) \quad (3)$$

where $WL_{E-net}$ is the wire length of nets crossing over the region, and $\lambda$ is a probability factor that is dependent on the locations of the regions between which the external net E-net extends in relation to the current region. For example, in FIG. 2, the probability factor $\lambda$ between Region 1 and Region 7 extending across Region 4 may be high, e.g., 90 percent, while the probability factor $\lambda$ between Region 1 and Region 9 extending across Region 4 may be low, e.g., 10 percent.

FIG. 4 illustrates a flow diagram 400 of a method of computing the external routing demand number for the region in FIG. 3.

In step 402, an external net for the region is selected from the floor plan.

In step 404, the wire length of the external net is retrieved from the floor plan.

In step 406, the wire length of the external net is adjusted for the size of the region, that is, to equal the distance traversed by the wires within the region.

In step 408, the function defined by formula (3) is computed.

In step 410, if more external nets remain in the region, then control is transferred to step 402. Otherwise, control is transferred to step 412.

In step 412, the external routing demand number for the external net is added to the routing demand number.

In step 414, the external routing demand number is generated as output.

The total routing demand number for the region includes the internal routing demand number and the external routing demand number according to formulas (2) and (3) above. The same methods described above with reference to FIGS. 3 and 4 may be used to compute the routing demand numbers for each region in the floor plan. Various degrees of demand by region in the floor plan may be indicated, for example, by a colored or shaded map.

FIG. 5 illustrates an example of a routing demand map 500 of a floor plan of an integrated circuit design according to an embodiment of the present invention. Shown in FIG. 5 are the routing demand for a region "1" 502, a region "2" 504, and a region "3" 506. In this example, the routing demand numbers for the region "1" 502, the region "2" 504, and the region "3" 506 are mapped to different shading patterns to indicate that the routing demand in region "3" 506 is the highest, the routing demand in region "2" 504 is the next highest, and the routing demand in region "1" 502 is the lowest.

The routing resource number (RRN) is a technology dependent parameter that defines the routing resources available to the region, for example, the number of metal layers, the number of tracks per layer, and the coordinates of the region. Once the routing resource number and the routing demand number have been computed for a region, then the congestion may be calculated according to formula (1) above. The regions in which the routing demand number is greater than the routing resource number have congestion. Various degrees of congestion in the floor plan may be indicated, for example, by a colored or shaded map.

FIG. 6 illustrates an example of a congestion map 600 of the floor plan of FIG. 5. Shown in FIG. 6 are the congestion estimated values for the region "1" 502, the region "2" 504, and the region "3" 506. In this example, the congestion estimated values for the region "1" 502, the region "2" 504, and the region "3" 506 are mapped to different shading patterns to indicate that the congestion estimated value in region "2" 504 is the highest, the congestion estimated value in region "3" 506 is the next highest, and the congestion estimated value in region "1" 502 is the lowest.

FIG. 7 illustrates a flow diagram 700 of a method of estimating congestion according to an embodiment of the present invention.

In step 702, the register transfer level (RTL) code for an integrated circuit design is received as input.

In step 704, the RTL is mapped to library cells, for example, from a generic Advanced Design Format (ADF) library, according to well-known techniques.

In step 706, a generic ADF file is generated according to well-known techniques.

In step 708, the cell placement is generated from the generic ADF file according to well-known techniques.

In step 710, the connectivity and length matrix is generated from the cell placement according to well-known techniques.

In step 712, the cell placement information is used to identify regions and partitions in the floor plan as illustrated in FIG. 2.

In step 714, the routing demand number is calculated for each of the regions in the floor plan according to formulas (2) and (3) as described above with reference to FIGS. 3 and 4.

In step 716, a routing demand map of the floor plan is generated from the routing demand numbers calculated in step 714.

In step 718, the technology dependent parameters for the routing resources are received, for example, from a technology Advanced Format Design library, and mapped to each region in the floor plan.

In step 720, the routing resource number is computed for each of the regions in the floor plan from the technology dependent parameters received in step 718.

In step 722, a congestion estimation map is generated from the routing resource numbers generated in step 720 and the routing demand map generated in step 716. The congestion map reflects the congestion in the RTL code, advantageously providing insight into detecting and resolving congestion in the integrated circuit design.

An optional step 724 may be added in which the floor plan is optimized to relieve congestion indicated on the congestion map generated in step 722. For example, if the congestion estimate value for a region indicates that the is region is congested, then the routing demand for the region is high. The library elements within the region having a high routing demand number may be replaced with other library elements having the same functionality but a smaller routing demand number according to the advanced design format library. By reducing the individual routing demand numbers of the library elements, the total routing demand number of the region may be reduced, thereby reducing congestion. Additionally, external nets that have a high probability of extending across the region may be routed through regions having a smaller routing demand number, thereby redistributing the routing demand for a given technology having a constant routing resource number.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The methods illustrated in the flowchart descriptions above may be embodied in a computer program product and implemented by a computer according to well known programming techniques to perform the following functions:

generating a variable set representative of the inputs and outputs of logic elements in the netlist;

re-ordering the inputs and corresponding outputs of the logic elements in the variable set;

generating a key set representative of the inputs of the logic elements that are connected to the outputs;

assigning names in the variable set representative of equivalent outputs having two or fewer essential variables to the same variable name;

inserting names in the variable set that are representative of outputs having more than two essential variables; and assigning a value to each of the outputs having two or fewer essential variables.

In further embodiments of the computer program of the present invention, if the name of an input in the netlist is not found in the variable set, then the net is redundant and is accordingly removed from the netlist. Also, a back conus for the netlist may be constructed, that is, a graph of the paths from the outputs to the inputs. If there are outputs in the back conus that are not named in the variable set, then these outputs are not used. Accordingly, these outputs and the corresponding logic elements are also removed from the netlist.

While the invention herein disclosed has been described by means of specific embodiments and applications thereof, numerous modifications and variations may be made thereto by those skilled in the art without departing from the scope of the invention set forth in the following claims.

What is claimed is:

1. A method of estimating congestion for register transfer level code comprising steps for:
   receiving as input a floor plan mapped from the register transfer level code;
   identifying regions in the floor plan;
   computing routing demand numbers that include a wire length of each internal interconnect and a wire length of each external interconnect for each of the regions in the floor plan;
   computing routing resource numbers that include a number of routing tracks for each of the regions; and
   generating a congestion estimate of the register transfer level code as a function of the routing demand numbers and the routing resource numbers.

2. The method of claim 1 further comprising a step for generating a routing demand map from the routing demand numbers.

3. The method of claim 2 further comprising a step for generating routing resource numbers from technology dependent parameters for the regions in the floor plan.

4. The method of claim 3 further comprising a step for generating a congestion estimate map from the routing demand numbers and the routing resource numbers.

5. The method of claim 4 further comprising a step for optimizing the floor plan by relieving congestion indicated on the congestion map.

6. A method of estimating congestion for register transfer level code comprising steps for:
   receiving as input a floor plan mapped from the register transfer level code;
   identifying regions in the floor plan;
   computing routing demand numbers for the regions in the floor plan;
   computing routing resource numbers for the regions in the floor plan; and
   generating a congestion estimate of the register transfer level code as a function of the routing demand numbers and the routing resource numbers wherein the step for computing routing demand numbers further comprises steps for:
   (a) computing a number of library elements within one of the regions;
   (b) receiving routing attributes of the library elements from an Advanced Design Format library;
   (c) determining a destination and wire length of a net connected to an input or output pin of a library element in the one of the regions from the floor plan;
   (d) if the net is an external net, then transferring control to step (e), else transferring control to step (f);
   (e) computing a partial wire length of the external net inside the current region and transferring control to step (f);
   (f) selecting a full wire length of the net within the current region;
   (g) computing an internal routing demand number for the one of the regions substantially according to $RDN_{internal} = f(RDN_{element}, WL_{I-net}, \partial(WL_{E-net}))$ wherein $RDN_{element}$ is a sum of the routing demand numbers for every library element in the region, $WL_{I-net}$ is a wire length of internal interconnects, and $\partial(WL_{E-net})$ and is a partial wire length of the external net;
   (h) if more input or output pins remain in the one of the regions, then transferring control to step (b); else transferring control to step (i);
   (i) adding the internal routing demand number of step (g) to a routing demand number for the one of the regions; and
   (j) generating the internal routing demand number as output.

7. A method of estimating congestion for register transfer level code comprising steps for:
   receiving as input a floor plan mapped from the register transfer level code;
   identifying regions in the floor plan;
   computing routing demand numbers for the regions in the floor plan;
   computing routing resource numbers for the regions in the floor plan; and
   generating a congestion estimate of the register transfer level code as a function of the routing demand numbers and the routing resource numbers wherein the step for computing routing demand numbers further comprises steps for:
   (a) selecting an external net crossing over one of the regions from the floor plan;
   (b) computing a wire length of the external net from the floor plan;
   (c) adjusting the wire length of the external net for a size of the region;
   (d) computing an external routing demand number for the region substantially according to $RDN_{External} = f(WL_{E-net}, \lambda)$ wherein $WL_{E-net}$ is the wire length of the external net crossing over the region, and $\lambda$ is a probability factor;
   (e) if more external nets cross over the region, then transferring control to step (a); else transferring control to step (f);
   (f) adding the external routing demand number to the routing demand numbers; and
   (g) generating the external routing demand number as output.

8. A computer program product for estimating congestion for register transfer level code comprising:
   a medium for embodying a computer program for input to a computer; and
   a computer program embodied in the medium for causing the computer to perform steps for:
   receiving as input a floor plan mapped from the register transfer level code;
   identifying regions in the floor plan;
   computing routing demand numbers that include a wire length of each internal interconnect and a wire length of each external interconnect for each of the regions in the floor plan;

computing routing resource numbers that include a number of routing tracks for each of the regions in the floor plan; and generating a congestion estimate of the register transfer level code as a function of the routing demand numbers and the routing resource numbers.

9. The computer program product of claim 8 further causing the computer to perform a step for generating a routing demand map from the routing demand numbers.

10. The computer program product of claim 9 further causing the computer to perform a step for generating routing resource numbers from technology dependent parameters for the regions in the floor plan.

11. The computer program product of claim 10 further causing the computer to perform a step for generating a congestion estimate map from the routing demand numbers and the routing resource numbers.

12. The computer program product of claim 11 further causing the computer to perform a step for optimizing the floor plan by relieving congestion indicated on the congestion map.

13. A computer program product for estimating congestion for register transfer level code comprising:

a medium for embodying a computer program for input to a computer; and a computer program embodied in the medium for causing the computer to perform steps for:

receiving as input a floor plan mapped from the register transfer level code;

identifying regions in the floor plan;

computing routing demand numbers for the regions in the floor plan;

computing routing resource numbers for the regions in the floor plan; and generating a congestion estimate of the register transfer level code as a function of the routing demand numbers and the routing resource numbers wherein the step for computing routing demand numbers further comprises steps for:

(a) computing a number of library elements within one of the regions;

(b) receiving routing attributes of the library elements from an Advanced Design Format library;

(c) determining a destination and wire length of a net connected to an input or output pin of a library element in the one of the regions from the floor plan;

(d) if the net is an external net, then transferring control to step (e), else transferring control to step (f);

(e) computing a partial wire length of the external net inside the current region and transferring control to step (f);

(f) selecting a full wire length of the net within the current region;

(g) computing an internal routing demand number for the one of the regions substantially according to $RDN_{internal} = f(RDN_{element}, WL_{I-net}, \partial(WL_{E-net}))$ wherein $RDN_{element}$ is a sum of the routing demand numbers for every library element in the region, $WL_{I-net}$ is a wire length of internal interconnects, and $\partial(WL_{E-net})$ is a partial wire length of the external net;

(h) if more input or output pins remain in the one of the regions, then transferring control to step (b); else transferring control to step (i);

(i) adding the internal routing demand number of step (g) to a routing demand number for the one of the regions; and (j) generating the internal routing demand number as output.

14. A computer program product for estimating congestion for register transfer level code comprising:

a medium for embodying a computer program for input to a computer; and a computer program embodied in the medium for causing the computer to perform steps for:

receiving as input a floor plan mapped from the register transfer level code;

identifying regions in the floor plan;

computing routing demand numbers for the regions in the floor plan;

computing routing resource numbers for the regions in the floor plan; and generating a congestion estimate of the register transfer level code as a function of the routing demand numbers and the routing resource numbers wherein the step for computing routing demand numbers further comprises steps for:

(a) selecting an external net crossing over one of the regions from the floor plan;

(b) computing a wire length of the external net from the floor plan;

(c) adjusting the wire length of the external net for a size of the region;

(d) computing an external routing demand number for the region substantially according to $RDN_{External} = f(WL_{E-net}, \lambda)$ wherein $WL_{E-net}$ is the wire length of the external net crossing over the region, and $\lambda$ is a probability factor;

(e) if more external nets cross over the region, then transferring control to step (a); else transferring control to step (f);

(f) adding the external routing demand number to the routing demand numbers; and (g) generating the external routing demand number as output.

* * * * *